United States Patent [19]

Kim et al.

[11] Patent Number: 5,273,586

[45] Date of Patent: Dec. 28, 1993

[54] LOW PRESSURE CHEMICAL VAPOR DEPOSITION APPARATUS, WITH REMOVAL SYSTEM FOR REMAINING IONIZED GAS COMPONENTS

[75] Inventors: Yun-Kee Kim; Chun-Soo Bann, both of Seoul, Rep. of Korea

[73] Assignee: Samsung Electronics, Co., Ltd., Kyounggi-do, Rep. of Korea

[21] Appl. No.: 772,859

[22] Filed: Oct. 8, 1991

[30] Foreign Application Priority Data

Feb. 18, 1991 [KR] Rep. of Korea .................. 91-2572

[51] Int. Cl.⁵ .................. C23C 16/56; C23C 16/46
[52] U.S. Cl. .................. 118/723 E; 118/724; 118/725; 118/715
[58] Field of Search .................. 118/723, 724, 725, 715

[56] References Cited

U.S. PATENT DOCUMENTS

| | | | |
|---|---|---|---|
| 4,962,727 | 10/1990 | Harada | 118/725 X |
| 5,015,330 | 5/1991 | Okumura et al. | 118/730 X |
| 5,029,554 | 7/1991 | Miyashita et al. | 118/715 |
| 5,116,784 | 5/1992 | Ushikawa | 118/715 X |

OTHER PUBLICATIONS

Webster's II New Riverside Dictionary, p. 422, 1988.
Wolf, S. and R. N. Tauber, *Silicon Processing for the VLSI Era; vol. 1-Process Technology* (Lattice Press) 1990, pp. 192–195.
Pan, P., "Characteristics of Thin LPCVD Silicon Oxynitride Films", *EMIS Datareview RN-10183*, Oct. 1987, pp. 668–671.

Primary Examiner—Brian E. Hearn
Assistant Examiner—Jonathan D. Baskin
Attorney, Agent, or Firm—Cushman, Darby & Cushman

[57] ABSTRACT

A low pressure chemical vapor deposition apparatus is provided for removing particulate matter. The apparatus includes a bell jar, a quartz tube installed in the bell jar, a slotted quartz boat installed in the quartz tube and for holding wafers which are to be coated with film. The apparatus further includes a gas line for introducing a reactant gas into the chamber within the quartz tube, where the quartz boat is located, a gas inlet made of quartz, an MFC, a valve 10 a three-zone furnace for heating the quartz tube to a reaction temperature, a pump 4 for pumping out air and reactant gas from the chamber within the quartz tube, a door plate for placing the slotted quartz boat in the chamber a power source device for causing an electric current to charge contacts with a positive or negative bias which are provided on the door plate, and a main controller for operating the power source device.

1 Claim, 1 Drawing Sheet

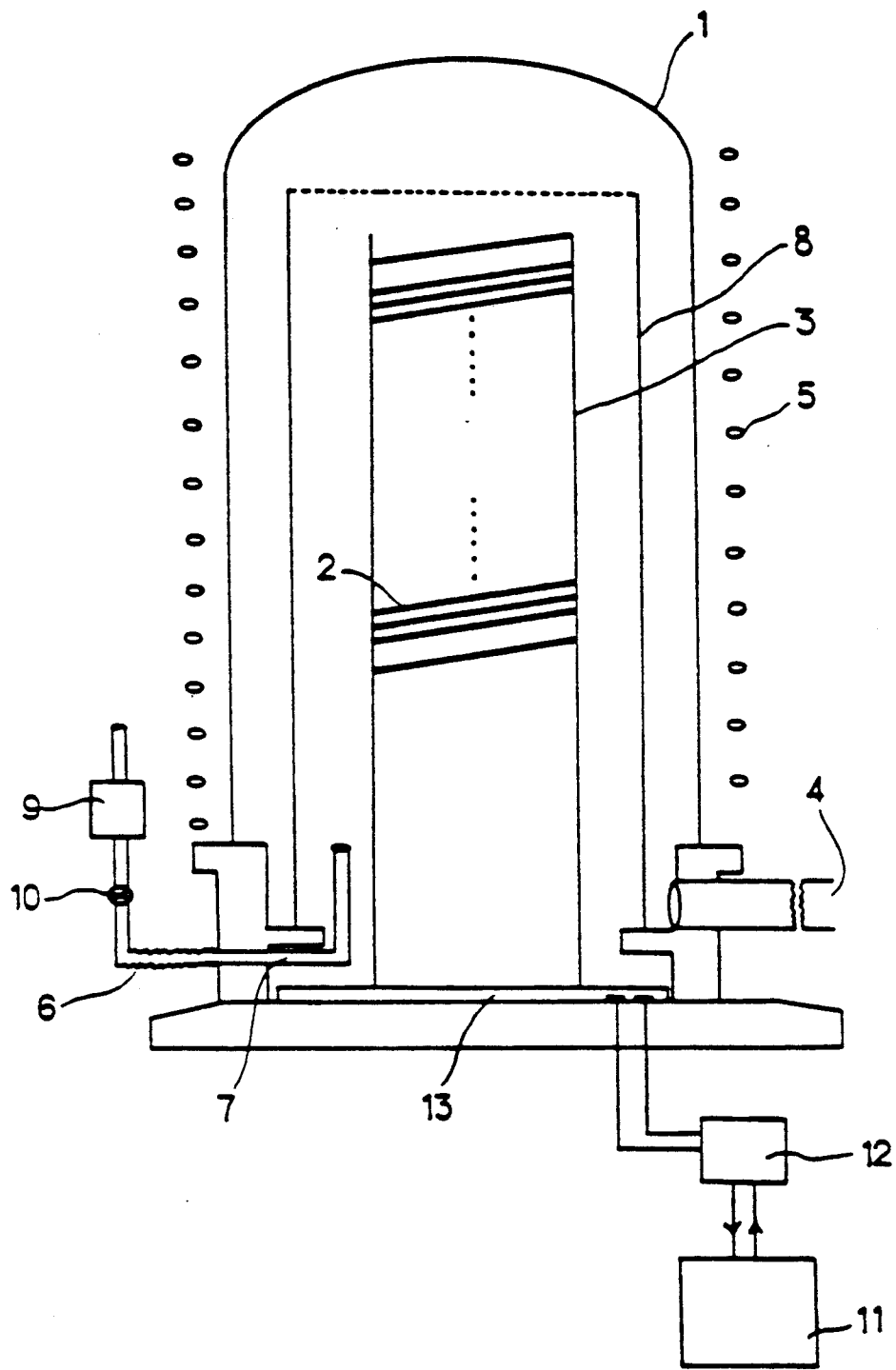

LOW PRESSURE CHEMICAL VAPOR DEPOSITION APPARATUS, WITH REMOVAL SYSTEM FOR REMAINING IONIZED GAS COMPONENTS

BACKGROUND OF THE INVENTION

1. Field of the Invention

The present invention relates to a low pressure chemical vapor deposition (LPCVD) apparatus for depositing a thin film on a substrate, and more particularly, to a low pressure chemical vapor deposition (LPCVD) apparatus which includes means for pumping out unreacted gas and for curtailing further reaction involving the remaining unreacted gas by attaching components of the unreacted gas which remain in a positive or negative ionic condition, to a door plate, so as to form on the substrate a film having excellent uniformity, and to remove particulate matter from within the reactor.

2. Description of the Related Art

In general, chemical vapor deposition (hereinafter referred to as CVD) forms thin films on the surface of a substrate by decomposition of gaseous compounds introduced into a reactor. However, a conventional CVD system has a disadvantage that some reactant gas components which remain in a positive or negative ionic condition are not deposited on the substrate to become part of a respective thin film on the substrate, but remain in the chamber of the reactor as particulate matter unnecessary to deposit the film. Each of such components include $NH_4Cl$ and $Si_xP_y$.

Accordingly, it is difficult to deposit the film with excellent uniformity.

In a conventional low pressure chemical vapor deposition (hereinafter referred to as LPCVD) apparatus, the reactant gas is introduced at the one end of the chamber of the reactor and pumped out at the opposite end of the chamber of the reactor, using a pump, so that the CVD film is directly deposited from the gas phase within the chamber onto the surface of a heated substrate positioned within the chamber.

After the film has been deposited to a desired thickness, the unreacted gas remaining in the chamber within the quartz tube which forms the peripheral sidewall of the reactor is pumped out using the pump, so that the chamber within the quartz tube maintains a low pressure. By this means, particulate matter is removed from a conventional LPCVD apparatus.

The LPCVD apparatus has a disadvantage that the deposited film simultaneously coats both the substrate on which it is intended that a film be formed, and the inside of the tube for example, the inner peripheral wall of the quartz tube or the paddle which is conventionally provided, so that unreacted gas remaining in the chamber is reacted at a fabrication step thereafter.

Therefore, the unreacted gas functions as a major source of particulate matter which becomes deposited onto the surface of the substrate, such as a wafer disposed in the chamber within the quartz tube.

In another conventional apparatus, after the CVD film is deposited to a desired thickness onto the surface of the wafer in the chamber within the quartz tube, $N_2$ gas is introduced into the chamber and the unreacted gas remaining in the chamber within the quartz tube is pumped out.

Then, the particulate matter is removed.

However, in this conventional apparatus, the $N_2$ gas is comparatively cold and therefore facilitates combinations among components of the unreacted gases remaining in the quartz tube, so that particulate matter is produced.

Therefore, it is a disadvantage that after the performance of the actual deposition step of the conventional CVD process, another step needs to be performed so that the films, which are deposited, are deposited with excellent uniformity, such additional step being required for reducing the particulate matter.

SUMMARY OF THE INVENTION

An object of the present invention is to provide a low pressure chemical vapor deposition apparatus for removing particulate matter by pumping out an unreacted gas, and for curtailing reaction among components of the unreacted gas.

According to the present invention, low pressure chemical vapor deposition apparatus for removing a particulate matter is provided which includes a bell jar, a quartz tube housed in the bell jar, and a slotted quartz boat housed in the quartz tube for holding a wafer which is to serve as a substrate for receiving a deposited film. A gas line is provided for introducing a reactant gas into the chamber within the quartz tube via a gas inlet made of quartz. The apparatus further includes an MFC, a three-zone furnace for heating the quartz tube to a reaction temperature for the reactant gas, a pump for pumping out air and reactant gas from the chamber within the quartz tube, a door plate which can be opened relative to the bell jar for placing the slotted quartz boat within the chamber of the quartz tube, a power source device for causing an electric current to flow at the door plate, and a main controller for operating the power source device.

BRIEF DESCRIPTION OF THE DRAWINGS

Other objects and features of the present invention will be described hereinafter in detail by way of a preferred embodiment with reference to the accompanying drawing, in which:

The sole FIGURE is a schematic vertical cross-sectional view showing a low pressure chemical vapor deposition (LPCVD) apparatus embodied according to principles of the present invention.

DETAILED DESCRIPTION OF THE PREFERRED EMBODIMENT OF THE INVENTION

A preferred embodiment of the present invention will be described hereinafter in detail with reference to the sole drawing FIGURE.

The drawing shows a low pressure chemical vapor deposition apparatus (hereinafter referred to as an LPCVD apparatus) according to the present invention.

In a vertical type of LPCVD apparatus which is shown, a bell jar 1 is domed over the CVD apparatus, and the semiconductor wafers constituting the substrates which are to be coated with a thin film are held horizontally in a slotted quartz boat 3.

The bell jar confines a space housing the CVD apparatus, so that the pressure within that space can be lowered to a desired pressure level.

The quartz tube of the CVD apparatus is heated to an appropriate temperature, for a predetermined time, by the three-zone furnace 5.

Then, the status of the chamber within the quartz tube is stabilized. $SiCl_2H_2$ and $NH_3$ gases (which are toxic) are introduced into the gas line 6 and the gas inlet 7, which is made of quartz. The introduced gases are diffused within the chamber of the quartz tube 8. The reacting gas is decomposed at a high temperature and decomposition constituents thereof are deposited onto the surface of the wafers and the inner peripheral surface of the quartz tube 8 heated by the three-zone furnace 5.

Therefore, NH+ group and Cl− group remain in the chamber.

The pump 4 pumps out the remainder of the reactant gas which has flowed from the tube 7, through the chamber within the quartz tube, and into the bell jar 1 into the space outside the quartz tube.

After the film has been deposited on the wafer substrates to the desired thickness, the reactant gas supply is cut by operating the MFC 9 and the valve 10.

The portions of the unreacted gas remaining ionized within the quartz tube 8 are pumped out by the pump 4.

Before or during a time period in which the temperature of the quartz tube is lowered by turning off the three-zone furnace 5 or cutting-off the reactant gas supply, the power source device 12 is turned on using the main controller 11, and a positive or negative power source is thereby coupled to the door plate 13 through electrical contact means.

The ionized portion of the unreacted gas deposited in the chamber within the quartz tube 8 and remaining at high temperature attaches to the door plate 13 due to the electrical characteristics of the ionized gas and the electrically charged door plate.

The ionized unreacted gas which does not stick to the door plate 13 is pumped out by the pump 4.

The temperature of the tube is sufficiently lowered and the slotted quartz boat 3 is carried out from the quartz tube 8. The film-coated wafers are unloaded from the slotted quartz boat 8.

The unreacted gas which has attached to the door plate 13 is removed from the surface of the door plate 13 by turning-off the power source device 12 or changing polarity using the main controller 11.

Therefore, the particulate matter deposited which the reactant gas supply is cut-off and the introduced gas being pumped out, is removed, so that the present invention can permit one to provide wafers on which the deposited film has excellent uniformity.

We claim:

1. In a low pressure chemical vapor deposition apparatus in which a mixture of reactant gases is introduced through a quartz tube into a chamber defined by an inner peripheral wall of a quartz tube supported upright on a door plate and domed-over by a bell jar which confines a space that is communicated to an evacuation pump, the quartz tube being effectively peripherally surrounded throughout its height by a three-zone furnace located externally of the bell jar, the door plate being arranged to removably support within the chamber a quartz boat provided with means for removably supporting thereon at least one wafer which is to be provided with a film by operation of the apparatus, the improvement wherein:

the door plate, during operation of the apparatus is in communication with said chamber, and is provided with electrical contact means for applying a positive and negative bias thereto; and power supply means are provided, and operatively connected with said electrode means, for selectively charging each said electrode, whereby ionized gas mixture components remaining in said chamber after said film has been deposited on said wafer by operation of said apparatus, can be selectively attracted to said electrode means for recovery, for thereby reducing internal contamination of said apparatus and external contamination of said wafer provided with said film.

* * * * *